United States Patent [19]

Nozokido et al.

[11] Patent Number: 5,162,737

[45] Date of Patent: Nov. 10, 1992

[54] MULTI-ECHO NMR IMAGING METHOD

[75] Inventors: Tatsuo Nozokido, Kokubunji; Etsuji Yamamoto, Akishima; Hideki Kohno, Tama, all of Japan

[73] Assignee: Hitachi, Ltd., Tokyo, Japan

[21] Appl. No.: 807,625

[22] Filed: Dec. 13, 1991

Related U.S. Application Data

[63] Continuation of Ser. No. 501,546, Mar. 30, 1990, abandoned.

[30] Foreign Application Priority Data

Mar. 31, 1989 [JP] Japan ................................. 1-78228

[51] Int. Cl.$^5$ ............................................ G01R 33/20
[52] U.S. Cl. .................................... 324/309; 324/307
[58] Field of Search .............. 324/309, 307, 308, 310, 324/313; 128/653 A

[56] References Cited

U.S. PATENT DOCUMENTS

| | | | |
|---|---|---|---|
| 4,581,582 | 4/1986 | Redington | 324/309 |
| 4,628,262 | 12/1956 | Maudsley | 324/309 |
| 4,739,266 | 4/1987 | Kunz | 324/309 |
| 4,760,339 | 7/1988 | Yamamoto et al. | 324/309 |
| 4,833,408 | 5/1989 | Yamamoto et al. | 324/309 |

FOREIGN PATENT DOCUMENTS 0226247 6/1987 European Pat. Off. .
0390175 10/1990 European Pat. Off. .

OTHER PUBLICATIONS

"Spin Echo Imaging of Multiple Chemical Shifts" by J. A. B. Lohman et al., Mag. Resonance in Medicine, 5, Jul. (1987), pp. 83-86.

"Resolution of NMR Chemical Shift Images Into Re and Im Components" by Yamamoto et al., Phys. Med. Biol. 1986, vol. 7, pp. 713-720.

"Separation of True Fat & Water Images by Correcting Mag. Field Inhomogeneity in Situ" by Yeung et al. Radiology, vol. 159, No. 3, pp. 783-786.

Primary Examiner—Louis Arana
Attorney, Agent, or Firm—Antonelli, Terry, Stout & Kraus

[57] ABSTRACT

A multi-echo NMR imaging method of obtaining images separated from each other with respect to two kinds of chemical shifts, typically, a fat image and a water image, includes performing the measurement of an object to be examined through a multi-echo sequence in which phase differences of $\theta_1 \neq n\pi$ and $\theta_2 = 2n\pi$ ($n = \pm 1, \pm 2, ---$) are respectively produced for first and second echoes between two kinds of spins to be separated from each other, deriving first and second complex images of the object from the first and second echoes, respectively, performing the measurement of a phantom exhibiting one of the chemical shifts through the multi-echo sequence and deriving third and fourth complex images of the phantom, eliminating phase errors due to a static magnetic field inhomogeneity from the first and second images using phase data of the third and fourth images respectively, and eliminating phase error due to a magnetic permeability distribution to the object.

4 Claims, 4 Drawing Sheets

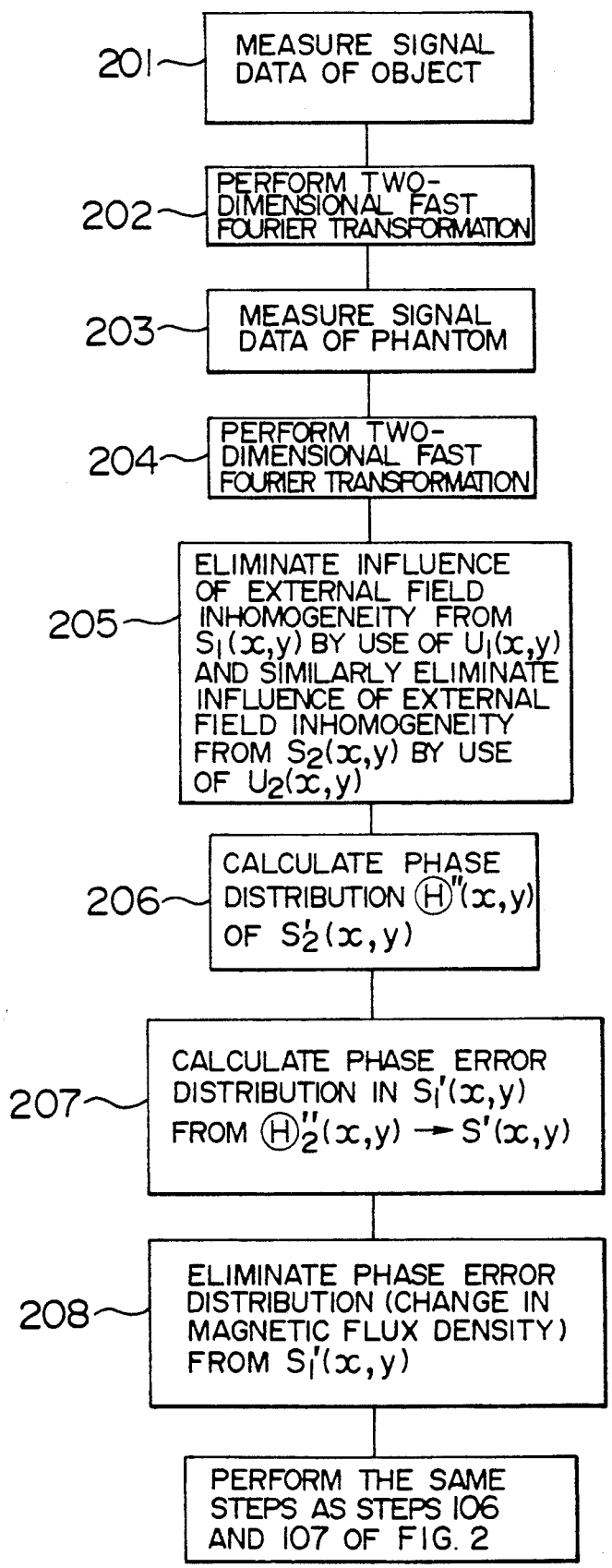

MULTI-ECHO NMR IMAGING METHOD

This application is a continuation of application Ser. No. 501,546, filed Mar. 30, 1990, now abandoned.

BACKGROUND OF THE INVENTION

The present invention relates to a method of providing a hydrogen or phosphorus distribution image of an object to be examined by use of a nuclear magnetic resonance (NMR) phenomenon, and more particularly to an imaging method of obtaining separative distribution images for two chemical shift exhibiting substances for a short time.

In an NMR imaging in which spins of atomic nuclei of hydrogen are to be examined, an image representative of the distribution of water contents in a living body and an image representative of the distribution of fat contents therein are separately obtained to increase the quantity of information necessary for diagnosis. There are known some approaches to obtain separative magnetization distribution images for two kinds of substances, in an object to be examined, which exhibit known chemical shifts. Radiology, Vol. 159 (1986), pp. 783-789 discloses a method using a multi-echo sequence which produces first and second echoes. This method includes a measurement based on a first multi-echo sequence in which chemical shift effects for the phases of two kinds of spins are cancelled for each of first and second echoes and a measurement based on a second multi-echo sequence in which a first echo produces a difference of $\pi$ between the phase shift effects for the two kinds of spins and a second echo produces a difference of $2\pi$ therebetween. Separative images are determined from four images which are obtained by such a method. U.S. Pat. No. 4,739,265, which has some common inventors with the inventors of the present application, proposes a method of obtaining two separative images by solving simultaneous equations of the real and imaginary parts of NMR image data acquired through a measurement sequence which produces a difference of $\pi/2$ or $(2n+1)\pi/2$ ($n=0, 1, 2, 3 \ldots$) between the phase shift effects for two kinds of spins to be separated from each other.

What is common to the two conventional methods mentioned above is that phase encoding is used for a mapping in a first direction and a read-out gradient is used for a mapping in a second direction. Accordingly, as well known, the measurement sequence must be repeated n times while changing the value of integration of the phase encoding gradient with respect to time in n ways, in order to obtain images having n pixels for the first direction. In the former of the above two conventional methods, since such a consecutive repetition of the measurement sequence is performed for each of the two kinds of multi-echo sequence, there is involved a drawback that an object to be examined is placed under restraint within the NMR apparatus for a long time.

SUMMARY OF THE INVENTION

In the latter of the above two conventional methods, the measurement of an NMR image of a homogeneous phantom containing one kind of spin is additionally performed in order to eliminate the effect or influence of static magnetic field inhomogeneity which appears as the result of shift in spin phase in a similar manner to the effect of chemical shift. The thus acquired data concerning the static magnetic field inhomogeneity is used to eliminate a static magnetic field inhomogeneity-induced phase error contained in an image of an object to be examined which is obtained from the above-mentioned specified measurement sequence. However, the object to be imaged has a magnetic permeability distribution of its own. Strictly speaking, therefore, the static magnetic field inhomogeneity change when each one specified object to be examined is inserted into the NMR apparatus. In other words, though the static magnetic field inhomogeneity detected by the measurement of the NMR image of the homogeneous phantom can be regarded as being the inhomogeniety of a static magnetic applied to the object from the NMR apparatus, the phase of spins upon measurement of the object encounters in combination the effect of chemical shift, the effect of the inhomogeneity of the externally applied static magnetic field, and the effect of a change in magnetic flux density depending on the magnetic permeability distribution of the object. As a result, it has been revealed that the conventional method as mentioned above has a problem that the quantifiability or estimability of separative images for two kinds of chemical shifts is deteriorated since the phase shift induced by the change in magnetic flux density cannot be removed.

One object of the present invention is to provide an NMR imaging method which requires a short time of restraint of an object to be examined for measurement thereof and is capable of obtaining separative images which have excellent quantifiability or estimability, that is, images in which two kinds of spins exhibiting different chemical shifts are accurately separated from each other.

Another object of the present invention is to provide an NMR imaging method which is capable of easily eliminating phase error components in images and in which a phase error caused by a change in magnetic flux density depending on the magnetic permeability distribution of an object to be examined is also eliminated.

The present invention employs a multi-echo sequence in which two or more echoes are generated (or echoes are generated two or more times) after one spin excitation. What is the most characteristic of the present invention includes performing a consecutive measurement of an object with successive alteration in phase encode value through a multi-echo sequence in which a phase difference of $\theta_1 \neq n\pi$ and a phase difference of $\theta_2 = 2n\pi$ ($n = \pm 1, \pm 2, \ldots$) are respectively produced for a first echo and a second echo between two kinds of spins to be separated from each other, that is, spins exhibiting a chemical shift $\sigma_1$ and spins exhibiting a chemical shift $\sigma_2$, deriving first and second complex images from the first and second echoes, respectively, correcting the phase of the first image by converting a phase distribution of the second image into a distribution of phase error components contained in the first image which are caused by a static magnetic field inhomogeneity, and obtaining separative images for the two kinds of spins from real and imaginary parts of the first image corrected.

At each pixel point of the second image, the vectors of the two kinds of spins take the same direction or sense. Therefore, if an offset phase inherent to the apparatus is ignored, the phase distribution of the second image represents a phase error distribution caused by the static magnetic field inhomogeneity. On the other hand, a composite signal at each pixel point of the first image shows a vector in which the phase error distribution induced by the static magnetic field inhomogeneity is added to the composite vector of respective vectors of the two kinds of spins having different directions or senses. Accordingly, the phase error distribution in the first image can be reduced from the phase distribution of the second image and the complex image after having been subjected to the phase error correction results in an image representing the distribution of composite vectors of the two kinds of spins.

Especially, provided that the phase difference $\theta_1$ is $\pi/2$ or $(2n+1)\pi/2$ and if the offset phase inherent to the apparatus is removed from the first image corrected, the real and imaginary parts of the obtained complex image provide magnetization distribution images of the two kinds of spins to be separated from each other as they are.

According to the method of the present invention as mentioned above, the phase error distribution obtained from the second image shows a static magnetic field inhomogeneity obtained in a state in which an object to be examined is actually inserted in the NMR apparatus. Namely, irrespective of a specified magnetic permeability distribution possessed by the object inserted in the NMR apparatus, the phase error distribution obtained from the second image shows an effective static magnetic field inhomogeneity which includes a change in magnetic flux density caused by the insertion of the object in the NMR apparatus. Accordingly, a complex image obtained by correcting the phase error distribution accurately shows the distribution of composite vectors of the two kinds of spins.

In the case where the static magnetic field inhomogeneity is large and a phase error distribution caused by the large static magnetic field inhomogeneity exceeds a range of $\pm\pi$, a phase distribution image of the second image includes discontinuous points which are produced due to aliasing. In such a case, it is necessary to make a correction for aliasing through observation of the phase distribution of the second image prior to conversion into a phase error distribution. Alternatively, there may be employed a method in which an image of a homogeneous phantom is obtained by the same measurement sequence as that for the measurement of the object to be examined, phase errors caused by the static magnetic field distribution (which does not contain a change in magnetic flux density depending on a magnetic permeability distribution of the object to be examined are eliminated from the above-mentioned first and second images by use of the phantom image so that the remaining phase error contained in each of the first and second images is only a phase error caused by the change in magnetic flux density, and the above-mentioned correction for the phase error components by the phase distribution of the second image is thereafter performed.

BRIEF DESCRIPTION OF THE DRAWINGS

FIG. 5 is a flow chart illustrating a processing performed in another embodiment of the present invention.

DESCRIPTION OF THE PREFERRED EMBODIMENTS

Figure 1:
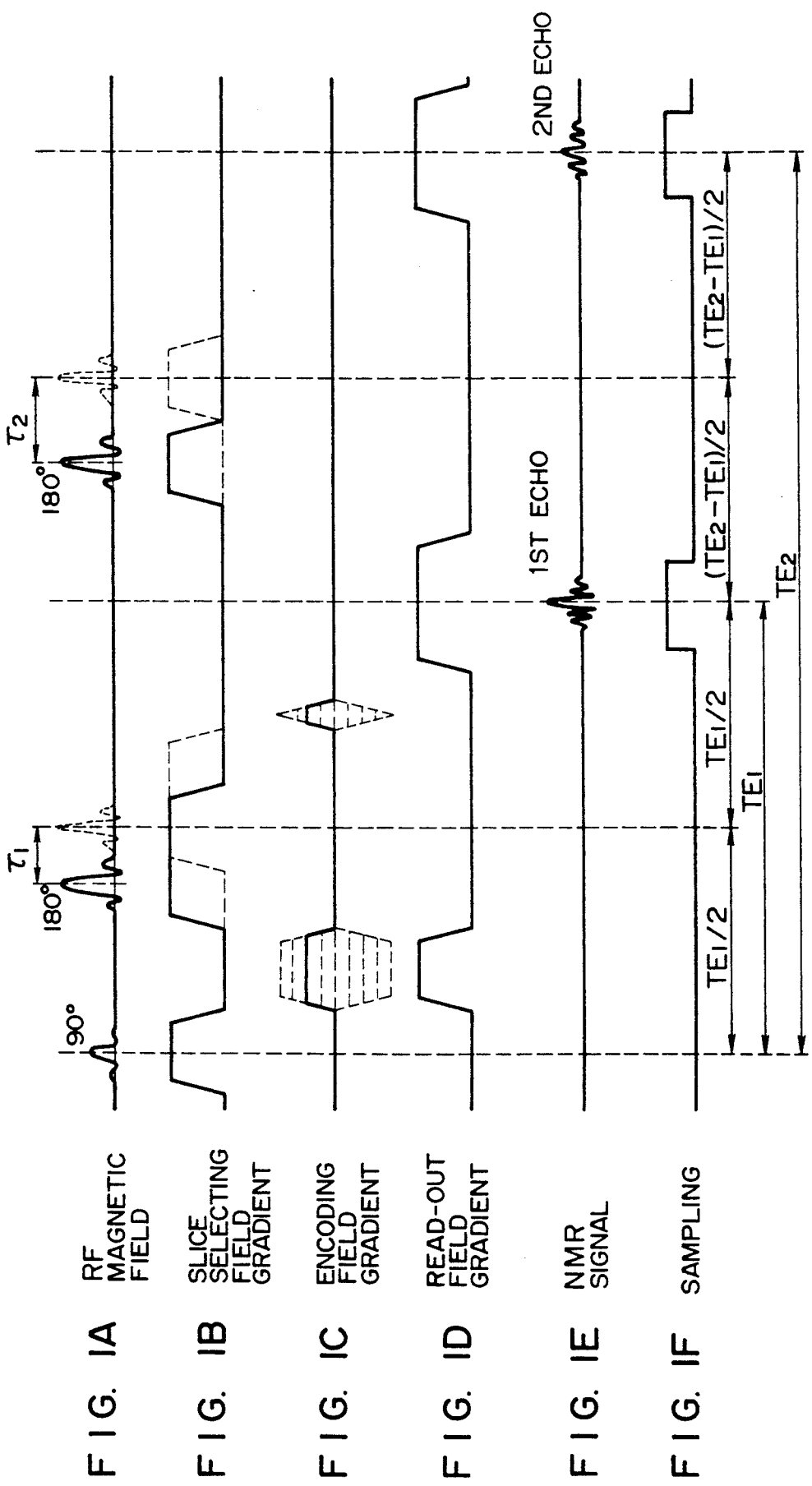
FIGS. 1A-1F show a time chart of a measurement sequence according to an embodiment of the present invention.

FIGS. 1A to 1F show a pulse sequence used for measurement of an NMR signal of an object to be examined in an embodiment of the present invention. FIG. 1A shows the waveform of a radio frequency (RF) magnetic field additionally superimposed on a static magnetic field applied to a field of view for measurement, that is, a specified space in which the object to be examined is inserted. FIGS. 1B, 1C and 1D show the temporal changes of field gradients providing, to the intensity of the static magnetic field, gradients along three orthogonal z, x and y directions which are called a slice selecting gradient, an encoding gradient and a read-out gradient, respectively. In FIGS. 1A and 1B, the conventional multi-echo sequence in which the separation by chemical shifts is not effected is shown for comparison by broken lines. Solid lines show a multi-echo sequence according to the present embodiment having 180° RF pulses the timings of application of which are shifted from those in the conventional multi-echo sequence.

First, a slice selecting gradient is applied together with a 90° RF pulse to excite spins in a specified slice perpendicular to the z direction. A first 180° RF pulse having a peak at the point of time after the lapse of a time $TE_1/2 - \tau_1$ from the point of time of peak of the 90° RF pulse (or time origin) is applied together with a slice selecting gradient. Though the peak of a Hahn echo by the first 180° RF pulse is produced at the point of time after the lapse of a time $TE_1 - 2\tau_1$ from the time origin, the peak of the first echo or a gradient echo actually produced by the generation of a read-out gradient as shown in FIG. 1C appears at the point of time after the lapse of a time $TE_1$ from the time origin. A difference in phase between spins exhibiting different chemical shifts is produced in a period of time which corresponds to a time difference $2\tau_1$ between the Hahn echo and the gradient echo. In the present embodiment, $\tau_1$ is selected such that a phase difference of $\theta_1 = \pi/2$ is produced between two chemical shifts $\sigma_1$ and $\sigma_2$ (in units of ppm) to be separated from each other. Next, a second 180° RF pulse having a peak at the point of time after the lapse of a time $(TE_2 - TE_1)/2 - \tau_2$ from the peak of the first echo is applied to produce a second echo. In this case, too, a read-out gradient is generated so that the peak of the second echo or a gradient echo actually produced appears at the point of time after the lapse of a time $TE_2 - TE_1$ from the first echo. For the second echo, therefore, a time difference between a Hahn echo and the gradient echo is $2(\tau_2 - \tau_1)$ The value of $\tau_2$ is set such that a phase difference of $\theta_2 = 2\pi$ is produced between the two chemical shifts in the time difference of $2(\tau_2 - \tau_1)$ In general, $\tau_1$ and $\tau_2$ are set so as to satisfy the relation of $$\left. \begin{array}{l} \theta_1 \neq n\pi \\ \theta_2 = 2n\pi \end{array} \right\} \tag{1}$$

$(n = \pm 1, \pm 2, \ldots)$

The first and second echoes shown in FIG. 1E are respectively measured in periods of time shown in FIG. 1F or the periods of time when the read-out gradients are generated.

The above measurement sequence is repeated while successively altering the magnitudes of the encoding gradient shown in FIG. 1C, thereby acquiring a series of data containing information for spin mapping in the x and y directions for each of the first and second echoes.

Figure 2:
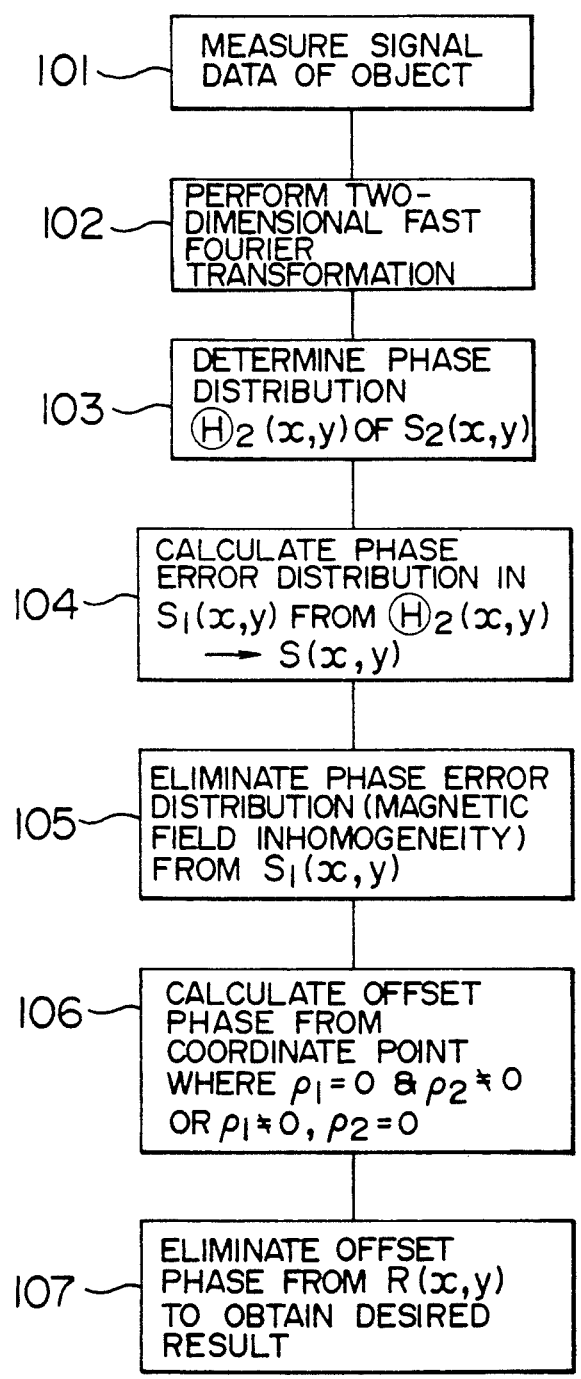
FIG. 2 is a flow chart illustrating a processing performed in the embodiment.

FIG. 2 shows in flow chart the whole of an imaging method in the present embodiment. In step 101, an object to be examined is inserted in a field of view for measurement and data measurement is made by the abovementioned consecutive measurement sequence. Next, in step 102, two-dimensional Fourier transformations are performed for a series of data acquired for the first echo and a series of data acquired for the second echo, respectively, to obtain a first complex image $S_1(x, y)$ and a second complex image $S_2(x, y)$. The first and second complex images can be represented by $$S_1(x, y) = \{\rho_1(x, y) + \rho_2(x, y) \exp(j\theta_1)\} \times \exp\{-j\gamma[E(x, y) + \sigma_1]\tau_1 + j\theta_1'\}$$
$$S_2(x, y) = \{\rho_1'(x, y) + \rho_2'(x, y) \exp(j\theta_2)\} \times \exp\{-j\gamma[E(x, y) + \sigma_1]\tau_2 + j\theta_2'\} \quad (2)$$

In the equation (1), $\rho_1(x, y)$ and $\rho_2(x, y)$ show the magnetization distributions of substances having the chemical shifts $\rho_1$ and $\rho_2$, that is, the density distributions of those substances, respectively. However, since a lateral relaxation time of magnetization for the second echo is in advance of that for the first echo, the equation for the second image $S_2(x, y)$ based on the second echo includes magnetization distributions represented by $\rho_1'(x, y)$ and $\rho_2'(x, y)$. In the equation (1), $\gamma$ is the gyromagnetic ratio, $\theta_1'$ and $\theta_2'$ are fixed phases which do not depend on coordinates, and $E(x, y)$ is the magnetic field inhomogeneity in the object to be examined.

Especially, provided that $\theta_1 = \pi/2$ and $\theta_2 = 2\pi$, as shown regarding the above-mentioned example, the first and second images can be represented by $$S_1(x, y) = \{\rho_1(x, y) + j\rho_2(x, y)\} \times \exp\{-j\gamma[E(x, y) + \sigma_1]\tau_1 + j\theta_1'\}$$
$$S_2(x, y) = \{\rho_1'(x, y) + \rho_2'(x, y)\} \times \exp\{-j\gamma[E(x, y) + \sigma_1]\tau_2 + j\theta_2'\} \quad (3)$$

Namely, in each pixel of the second image, the vectors of the two kinds of spins take the same direction or sense and the second image contains only a phase error $-\gamma E(x, y)$ caused by the static magnetic field inhomogeneity $E(x, y)$ if a phase term corresponding to one $\sigma_1$ of the chemical shifts and an offset phase are ignored.

Next, in step 103, a phase distribution $\theta_2(x, y)$ of the second image $S_2(x, y)$ is determined by the equation $$\theta_2(x, y) = \tan^{-1}\{Im[S_2(x,y)]/Re[S_2(x, y)]\} \quad (4)$$

wherein $IM[S_2(x, y)]$ is the imaginary part of the second image and $Re[S_2(x, y)]$ is the real part of the second image. The phase distribution $\theta_2(x, y)$ can be rewritten from the equation (3) as follows;

$$\theta_2(x, y) = -\gamma[E(x, y) + \sigma_1]\tau_2 + \theta_2'. \quad (5)$$

Next, in step 104, a conversion according to the following equation (6) is made for the obtained phase image $\theta_2(x, y)$ to determine an error distribution $S(x, y)$ contained in the first image which is caused by the static magnetic field inhomogeneity.

$$S(x, y) = \exp\{j(\tau_1/\tau_2)\theta_2(x, y)\}. \quad (6)$$

The thus obtained $S(x, y)$ can be represented from the equations (5) and (6) as follows:

$$S(x, y) = \exp\{-j\gamma[E(x, y) + \sigma_1]\tau_1 + (\tau_1/\tau_2)\theta_2'\}. \quad (7)$$

Next, in step 105, a product of the vector $S_1(x, y)$ of each pixel point of the first image and the complex conjugate vector $s^*(x, y)$ of each pixel point of the phase error distribution $S(x, y)$ is made to obtain a new image $R(x, y)$ in which the phase error caused by the static magnetic field inhomogeneity is eliminated from the first image. Namely, $R(x, y)$ is represented by the following equation:

$$R(x, y) = S_1(x, y) \times S^*(s, y) = \{\rho_1(x, y) + j\rho_2(x, y)\} \times \exp\{j(\theta_1' - (\tau_1/\tau_2)\theta_2')\} \quad (8)$$

If an offset phase underlined in the equation (8) is eliminated, a desired separation image $T(x, y)$ shown by the following equation (9) is obtained.

$$T(x, y) = \rho_1(x, y) + j\rho_2(x, y). \quad (9)$$

For that purpose, in step 106, the image $R(x, y)$ is searched for a phase $\theta_{off}$ at the coordinate (x, y) where $\rho_1 = 0$ and $\rho_2 \neq 0$ or $\rho_1 \neq 0$ and $\rho_2 = 0$. The phase $\theta_{off}$ is termed $\theta_R'$. For example, the complex vector $R'(x, y)$ of the coordinate (x, y) providing $\rho_1 \neq 0$ and $\rho_2 = 0$ is as follows:

$$R'(x, y) = \rho_1(x, y) \exp\{j(\theta_1' - (\tau_1/\tau_2)\theta_2')\}. \quad (10)$$

The phase term $\theta_R'$ of the equation (10) is as follows:

$$\theta_R' = \theta_{off} = \theta_1' - (\tau_1/\tau_2)\theta_2'. \quad (11)$$

Accordingly, in step 107, the determined $\theta_R'$ is used to eliminate the offset phase from the image $T(x, y)$ in accordance with the following equation:

$$T(x, y) = R(x, y) \times \exp(-j\theta_R'). \quad (12)$$

Since the complex image $T(x, y)$ thus obtained assumes the equation (9), the real part of the complex image $T(x, y)$ represents the spin density distribution $\rho_1(x, y)$ of the chemical shift $\sigma_1$ and the imaginary part thereof represents the spin density distribution $\rho_2(x, y)$ of the chemical shift $\sigma_2$.

The above is the flow of an image processing for obtaining separative images from two images which are obtained through the measurement of one time for an object in accordance with the multi-echo sequence shown in FIG. 1. What gives rise to a problem in the above processing is the operation of producing $S(x, y)$ shown by the equation (6). Namely, in the case where $E(x, y)$ is so small that the equation (5) actually satisfies the relation of $$-\pi \leq \theta_2(x, y) \leq +\pi, \quad (13)$$

S(x, y) can be simply calculated by the equation (7). However, as E(x, y) becomes larger, $\theta_2(x, y)$ does not actually satisfy the relation (13) though it apparently satisfies the relation (13). The reason is that $\theta_2(x, y)$ is calculated by the equation (4) and does never take values other than $-\pi \leq \theta_2(x, y) \leq \pi$ or $0 \leq \theta_2(x, y) \leq 2\pi$. In the case where the static magnetic field inhomogeneity is so large that the relation (13) is not satisfied, the phase image of $S_2(x, y)$ gives rise to aliasing. Namely, if the phase image $\theta_2(x, y)$ is displayed, an abrupt phase change from $-\pi$ to $\pi$ or from $\pi$ to $-\pi$ appears between adjacent coordinate points.

Figure 3:
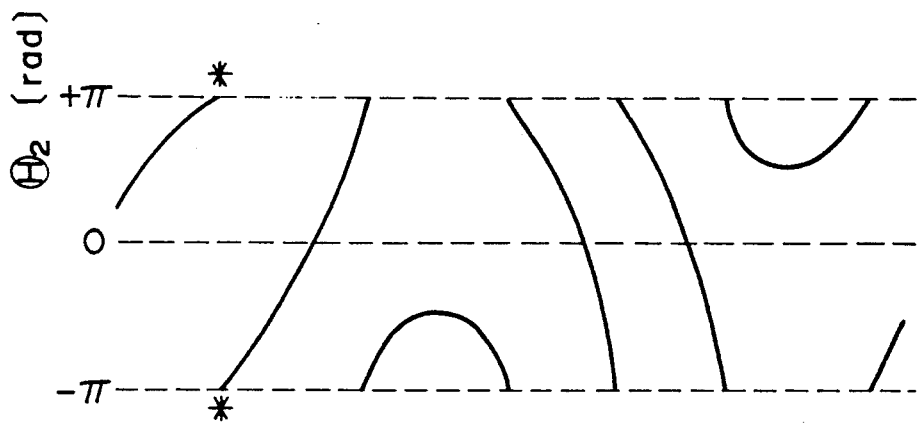
FIGS. 3 and 4 are cenceptual diagrams showing examples of correction for phase aliasing.
Figure 4:
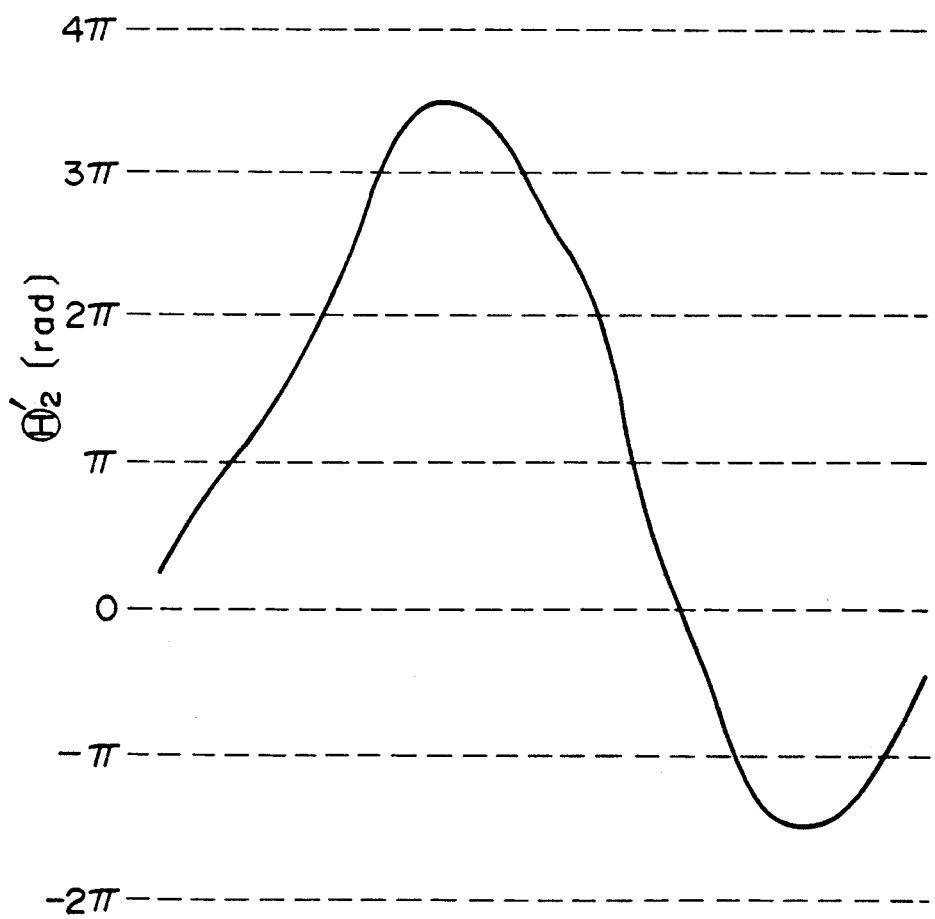

A certain one-dimensional value of $\theta_2(x, y)$ in such a case provides a representation as shown in FIG. 3. A change from $+\pi$ to $-\pi$ occurs at a location indicated by * in FIG. 3. In the case where the relation (13) is not satisfied, that is, in the case where $\theta_2(x, y)$ takes such a form as shown in FIG. 3, the calculation of the equation (6) is performed after the conversion of $\theta_2$ into $\theta_2'$ as shown in FIG. 4 has been made to provide the continuity of phase, considering that a spacial change of E(x, y) is smooth or E(x, y) continuously changes. Namely, in place of S(x, y) shown by the equation (6) is used S(x, y) according to the following equation:

$$S(x, y) = \exp\{j(\tau_1/\tau_2)\theta_2'(x, y)\}. \quad (14)$$

FIGS. 3 and 4 show a phase change in one dimension. In actual, however, since $\theta_2(x, y)$ is two-dimensional, a two-dimensional phase continuity processing is required.

In many cases, a calculation processing for making the two-dimensional phase continuity not only becomes complicated but also is hard to be successfully executed, for example, when the object to be examined is a complicated structure such as a human body.

A second embodiment of the present invention in which such a calculation processing is avoided will now be explained in reference to FIG. 5. The measurement of an object performed in step 201 and two-dimensional Fourier transformation performed in step 202 are quite similar to those in steps 101 and 102 in the first embodiment shown in FIG. 2. Thus, two complex images $S_1(x, y)$ and $S_2(x, y)$ are obtained. Next, in step 203, a phantom having a larger cross section than that of the object and containing uniformly only a substance exhibiting one chemical shift $\sigma_r$ is measured by the sequence shown in FIGS. 1A-1F, just like the case of the measurement of the object. Next, in step 204, a series data acquired for a first echo and a series of data acquired for a second echo are subjected to two-dimensional Fourier transformations, respectively, to obtain complex images $U_1(x, y)$ and $U_2(x, y)$. These images $U_1(x, y)$ and $U_2(x, y)$ are represented by the following equation (15) corresponding to the equation (3):

$$\begin{aligned} U_1(x, y) &= \rho_r(x, y) \exp\{-j\gamma[E_{st}(x, y) + \sigma_r]\tau_1 + j\theta_r\} \\ U_2(x, y) &= \rho_r'(x, y) \exp\{-j\gamma[E_{st}(x, y) + \sigma_r]\tau_2 + j\theta_r'\} \end{aligned} \quad (15)$$

wherein $\rho_r(x, y)$ and $\rho_r'(x, y)$ are the density distributions of the substance exhibiting the chemical shift $\rho_r$ in which the influence of lateral relaxation of magnetization is taken into consideration, like the case of the equation (3), $\theta_r$ and $\theta_r'$ are fixed phases which do not depend on coordinates, and $E_{st}(x, y)$ is the magnetic field inhomogeneity in the phantom which can be regarded as being the inhomogeneity of a static magnetic field externally applied to the object in the case where the phantom is sufficiently larger than the object.

Next, in step 205, $U_1$ and $U_2$ are used so that $S_1$ and $S_2$ of the equation (3) are subjected to the following operation (16) to eliminate from the images $S_1$ and $S_2$ a phase distribution which is caused by the inhomogeneity $E_{st}(x, y)$ of a static magnetic field applied:

$$\begin{aligned} S_1'(x, y) &= S_1(x, y) \times U_1^*(x, y)/|U_1(x, y)| \\ &= \{\rho_1(x, y) + j\rho_2(x, y)\} \times \\ &\quad \exp\{-j\gamma[E_{per}(x, y) + (\sigma_1 - \sigma_r)]\tau_1 + j(\theta_1' - \theta_r')\} \\ S_2'(x, y) &= S_2(x, y) \times U_2^*(x, y)/|U_2(x, y)| \\ &= \{\rho_1(x, y) + \rho_2'(x, y)\} \times \\ &\quad \exp\{-j\gamma[E_{per}(x, y) + (\sigma_1 - \sigma_r)]\tau_2 + j(\theta_2' - \theta_r')\} \end{aligned} \quad (16)$$

wherein $E_{per}(x, y)$ represents a change in magnetic flux density depending on the magnetic permeability distribution of the object to be examined and satisfies the relation of $E(x, y) = E_{st}(x, y) + E_{per}(x, y)$ in connection with the magnetic field inhomogeneity E(x, y) in the object to be examined.

Next, in step 206, there is determined a phase distribution $\theta''(x, y)$ of the image $S_2'(x, y)$ from which only the phase error caused by the inhomogeneity of the externally applied static magnetic field is eliminated. $\theta''(x, y)$ is represented by the following equation:

$$\theta_2''(x, y) = -\gamma[E_{per}(x, y) + (\sigma_1 + \sigma_2)]\tau_2 + j(\theta_2' - \theta_r')\}. \quad (17)$$

The generally called static magnetic field inhomogeneity E(x, y) is the sum of the inhomogeneity $E_{st}(x, y)$ of the static magnetic field externally applied to the object to be examined and the change $E_{per}(x, y)$ in magnetic flux density depending on the magnetic permeability distribution of the object to be examined. $E_{per}(x, y)$ is far smaller than $E_{st}(x, y)$. Accordingly, $\theta_2''(x, y)$ from which $E_{st}(x, y)$ is eliminated can practically satisfy the relation (13) at all coordinates (x, y). Namely, the processing mentioned in conjunction with the first embodiment is not required.

Next, in step 207, the phase distribution $\theta_2''(x, y)$ is converted into a phase error distribution contained in the image $S_1'(x, y)$. Namely, in a similar manner to the equation (6), S'(x, y) is determined by the following equation:

$$S'(x, y) = \exp\{j(\tau_1/\tau_2)\theta_2''(x, y)\}. \quad (18)$$

Next, in step 208, a phase error contained in the image $S_1'(x, y)$ (or a phase error corresponding to the change in magnetic flux density depending on the permeability distribution of the object to be examined) is eliminated. Namely, there is obtained R(x, y) according to the following equation:

$$\begin{aligned} R(x, y) &= S_1'(x, y) \times S'^*(x, y) \\ &= \{\rho_1(x, y) + j\rho_2(x, y)\} \times \\ &\quad \exp\{j(\theta_1' - (\tau_1/\tau_2)\theta_2')\}. \end{aligned} \quad (19)$$

Subsequently, steps similar to steps 106 and 107 shown in FIG. 2 in conjunction with the first embodiment are performed so that an offset phase is eliminated, thereby obtaining separative images $\rho_1(x, y)$ and $\rho_2(x, y)$.

As has been mentioned, the search for a phase at the coordinate (x, y) where $\rho_1=0$ and $\rho_2 \neq 0$ or $\rho_1 \neq 0$ and $\rho_2=0$ must be made in order to eliminate the offset phase $\theta_{off}$. In order to eliminate the offset phase $\theta_{off}$ without performing such a processing, a reconstructed image is used which is obtained at timing when $\theta_1$ and $\theta_2$ are 0, respectively, that is, in accordance with the conventional multi-echo sequence. In the case where $\tau_1 = \tau_2 = 0$, that is, $\theta_1 = \theta_2 = 0$, $S_1(x, y)$ and $S_2(x, y)$ of the equation (3) can be written as $S_{10}(x, y)$ and $S_{20}(x, y)$ of the following equation:

$$\left.\begin{aligned}
S_{10}(x, y) &= S_1(x, y) | \theta_1 = 0 \\
&= \{\rho_1(x, y) + \rho_2(x, y)\} \exp(j\theta_1') \\
S_{20}(x, y) &= S_2(x, y) | \theta_2 = 0 \\
&= \{\rho_1(x, y) + \rho_2(x, y)\} \exp(j\theta_2').
\end{aligned}\right\} \quad (20)$$

By use of $S_{10}(x, y)$ and $S_{20}(x, y)$, $\theta_1'$ and $\theta_2'$ are eliminated from the images shown by the equation (3) to obtain images $P_1$ and $P_2$ of the following equation:

$$\left.\begin{aligned}
P_1(x, y) &= S_1(x, y) \times S_{10}^*(x, y) / |S_{10}(x, y)| \\
&= \{\rho_1(x, y) + j\rho_2(x, y)\} \exp \\
&\quad \{-j\gamma[E(x, y) + \rho_1]\tau_1\} \\
P_2(x, y) &= S_2(x, y) \times S_{20}^*(x, y) / |S_{20}(x, y)| \\
&= \{\rho_1'(x, y) - \rho_2'(x, y)\} \exp \\
&\quad \{-j\gamma[E(x, y) + \sigma_1]\tau_2\}.
\end{aligned}\right\} \quad (21)$$

If the processing on and after the equation (4) is conducted by use of $P_1(x, y)$ and $P_2(x, y)$, the underlined portion of the equation (8) takes 1 (one) or a desired separation image T(x, y) can be obtained without performing the processing on and after the equation (10).

As is apparent from the foregoing explanation, the above-mentioned method of eliminating $\theta_{off}$ involves an increased measurement time since the measurement by the conventional multi-echo sequence in which $\tau_1$ and $\tau_2$ in FIG. 1 are 0 is required in addition to the measurement of data for chemical shift imaging. However, the measurement by the conventional multi-echo sequence enables to make a measurement with pixels (or, more particularly, encode values to be altered) the number of which is small as compared with those in the measurement of data for chemical shift imaging and hence an undue increase of the overall measurement time for the object to be examined can be avoided.

The above-mentioned offset phase eliminating method following the conventional multi-echo sequence is similarly applicable to the method shown in FIG. 5 in which the homogeneous phantom is used. In this case, the measurement by the conventional multi-echo sequence is performed for not only the object to be examined but also the homogeneous phantom, $\theta_1'$ and $\theta_2'$ in the equation (3) and $\theta_r$ and $\theta_r'$ in the equation (15) are eliminated in a manner shown by the equation (21) and the processing on and after the equation (16) is performed.

We claim:

1. An NMR imaging method for measuring nuclear spin information of an object using an NMR imaging system having an inspection zone to which a static magnetic field is applied, the imaging method including the steps of:

i) measuring spin data of the object by disposing the object of the inspection zone and by effecting a multi-echo NMR measurement sequence to obtain first and second two-dimensional spin data sets, the multi-echo NMR measurement sequence including the steps of, a) exciting spins in the object in the inspection zone, b) applying a phase encoding gradient of a time-intensity product to the static magnetic field according to a program, c) sequentially applying first and second 180° RF pulses to the object to generate first and second Hahn echoes, d) applying a read-out gradient to the static magnetic field to generate first and second gradient echoes, respectively, corresponding to the first and the second Hahn echoes, and measuring the first and the second gradient echoes, respectively, wherein a first time difference between the first Hahn echo and the first gradient echo provide two chemical shifts of the spins in the object with a predetermined phase difference other than $n\pi$ (where n is a integer), and a second time difference between the second Hahn echo and the second gradient echo provide the two chemical shifts with a phase difference of $2n\pi$, and e) repeating the steps a) to d) a plurality of times while changing the time-intensity product of the phase encoding gradient to obtain the first spin data set representing the first gradient echo measured through the repetitions and the second spin data set representing the second gradient echo measured through the repetitions;

ii) measuring spin data of a phantom having one of the two chemical shifts by disposing the phantom in the inspection zone and by effecting the multi-echo NMR measurement sequence to obtain third and fourth two-dimensional spin data sets;

iii) obtaining first and second image data by effecting two-dimensional Fourier transformation respectively on the first and the second two-dimensional spin data sets;

iv) obtaining third and fourth image data by effecting two-dimensional Fourier transformation respectively on the third and the fourth two-dimensional spin data sets;

v) respectively eliminating phase error distributions due to inhomogeneity of the static magnetic field from the first and the second image data by respectively using phase distributions of the third and the fourth image data as respective compensation data and resultantly obtaining fifth and sixth image data; and vi) eliminating a phase error distribution due to a magnetic permeability distribution of the object from the fifth image data by using a phase distribution calculated from the sixth image data as compensation data and resultantly obtaining seventh image data including spin distribution information of the two chemical shifts.

2. An NMR imaging method according to claim 1, wherein the phantom has a larger section than that of the object and contains uniformly a substance exhibiting one of the two chemical shifts.

3. An NMR imaging method according to claim 1, further comprising a step of eliminating an offset phase which does not depend upon positions from the seventh image data.

4. An NMR imaging method according to claim 3, said offset phase is detected from a phase of a data of a pixel on the seventh image data at which only one of the chemical shifts exhibits.

* * * * *